United States Patent [19]

Mogi

[11] 4,326,220
[45] Apr. 20, 1982

[54] TELEVISION RECEIVER

[75] Inventor: Takao Mogi, Tokyo, Japan

[73] Assignee: Sony Corporation, Tokyo, Japan

[21] Appl. No.: 183,587

[22] Filed: Sep. 2, 1980

[30] Foreign Application Priority Data

Sep. 5, 1979 [JP] Japan .................................. 54-113992

[51] Int. Cl.³ .............................................. H04N 5/44
[52] U.S. Cl. .................................. 358/191.1; 455/179
[58] Field of Search ...................... 358/188, 191.1, 127; 455/179, 275, 166, 167

[56] References Cited

U.S. PATENT DOCUMENTS 4,167,704  9/1979  Sato et al. ........................... 455/179

Primary Examiner—Richard Murray
Attorney, Agent, or Firm—Lewis H. Eslinger; Alvin Sinderbrand

[57] ABSTRACT

A television receiver includes first and second signal receiving circuits corresponding to first and second channels, each circuit having a tuner and VIF amplifier with each tuner being response to a tuning control voltage supplied thereto; first and second storage elements for storing the respective tuning control voltages and supplying the same to the first and second tuners, respectively; a feedback circuit connected in common between each of the tuners and its respective storage element and selectively operative to supply a tuning control voltage to one of the first and second storage elements; a first switching device connected between the feedback circuit and the first and second tuners and a second switching device connected between the feedback circuit and the first and second storage elements; a channel selection device for energizing the first and second switching devices to connect the feedback circuit between the first or second tuners and first or second storage elements, respectively, in response to the selection of one of the channels; a control circuit for supplying channel input data to the feedback circuit in response to the channel selection for controlling the operation of the feedback circuit; and first and second automatic fine tuning circuits for maintaining the value of the tuning control voltage in the first and second storage elements at a constant value after the feedback circuit is no longer operative with the first and second signal receiving circuits, respectively.

18 Claims, 4 Drawing Figures

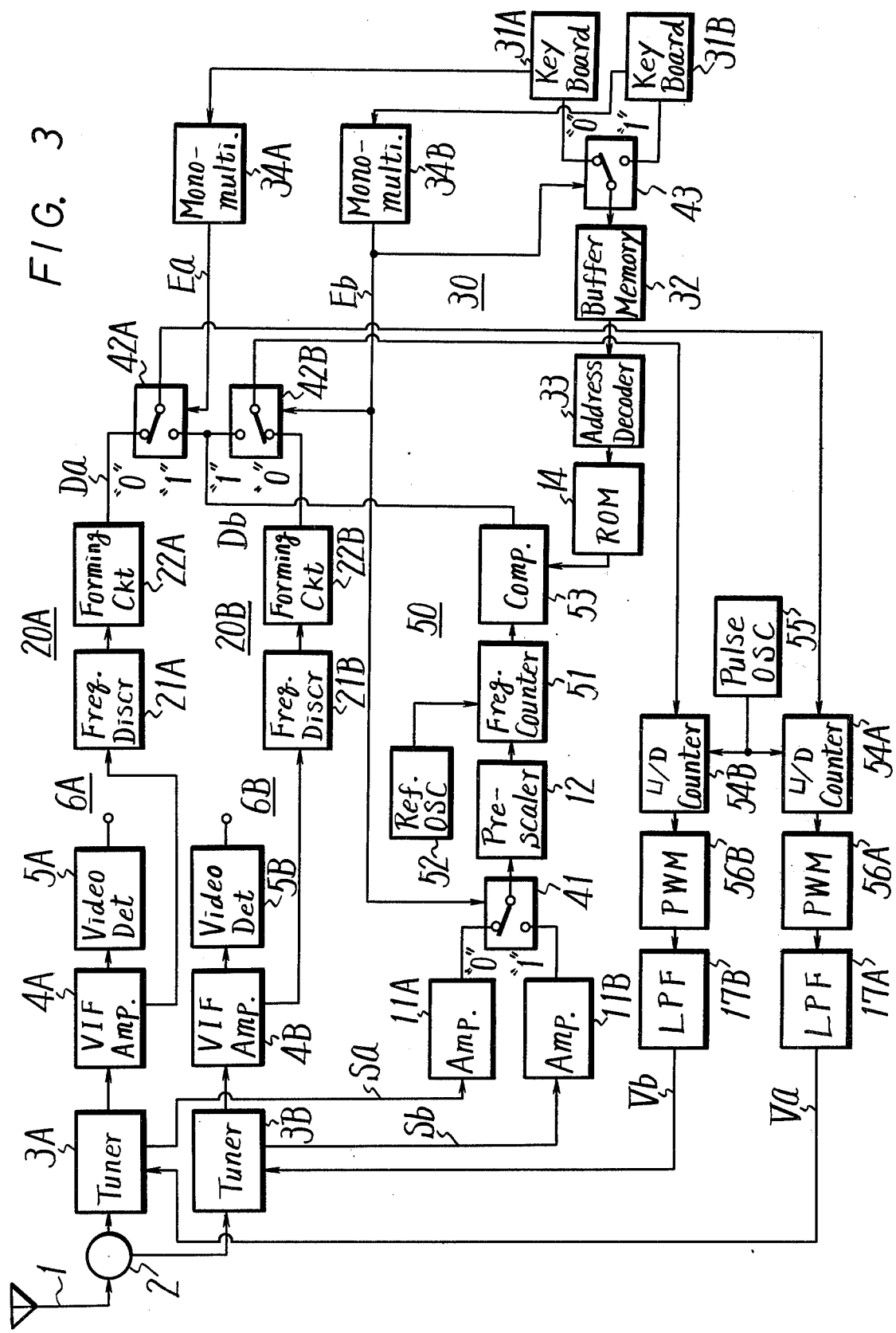

TELEVISION RECEIVER

BACKGROUND OF THE INVENTION

1. Field of the Invention

The present invention relates generally to television receivers, and, more particularly, is directed to a television receiver having a plurality of signal receiving systems.

2. Description of the Prior Art

With prior art television receivers, in order to reproduce a picture of one channel on a screen on which a picture of another channel is presently being reproduced, for example, the picture of the one channel being of a small size (picture-in-picture), it has been necessary to provide two signal receiving systems to receive the two channels.

In like manner with prior art television receivers provided with an integral video tape recorder (VTR), in order to reproduce and watch a main-program while recording a sub-program on the VTR, two signal receiving systems for the sub- and main-programs are also required.

In such case, if a tuner used therein is of the electronic tuning type, an associated circuit such as a PLL (phase locked loop) circuit and the like is also necessary for each of the two channels. This, of course, makes such prior art television receivers expensive.

OBJECTS AND SUMMARY OF THE INVENTION

Accordingly, it is an object of this invention to provide a television reciever that avoids the above-described difficulties encountered with the prior art. More particularly, it is an object of the present invention to provide a television receiver which is economical and inexpensive.

Another object of the invention is to provide a television receiver which includes a single inexpensive associated circuit that can be utilized for accurately tuning the receiver to a plurality of channels.

In accordance with an aspect of the present invention, a television receiver includes at least two signal receiving means, each corresponding to a respective channel and each including tuning means for selecting the respective channel in response to a tuning control signal; storage means for storing each of the tuning control signals and for supplying the tuning control signals to the respective tuning means; and feedback means common to each of the at least two receiving means and adapted to be selectively operative with one of the at least two signal receiving means for producing the tuning control signal for the signal receiving means with which it is operative and supplying the respective tuning control signal to the storage means.

The above, and other objects, features and advantages of the present invention will become apparent from the following detailed description of illustrative embodiments of the invention which is to be read in connection with the accompanying drawings.

BRIEF DESCRIPTION OF THE DRAWINGS

FIG. 3 is a block diagram of a television receiver according to another embodiment of this invention.

DESCRIPTION OF THE PREFERRED EMBODIMENTS

Figure 1:
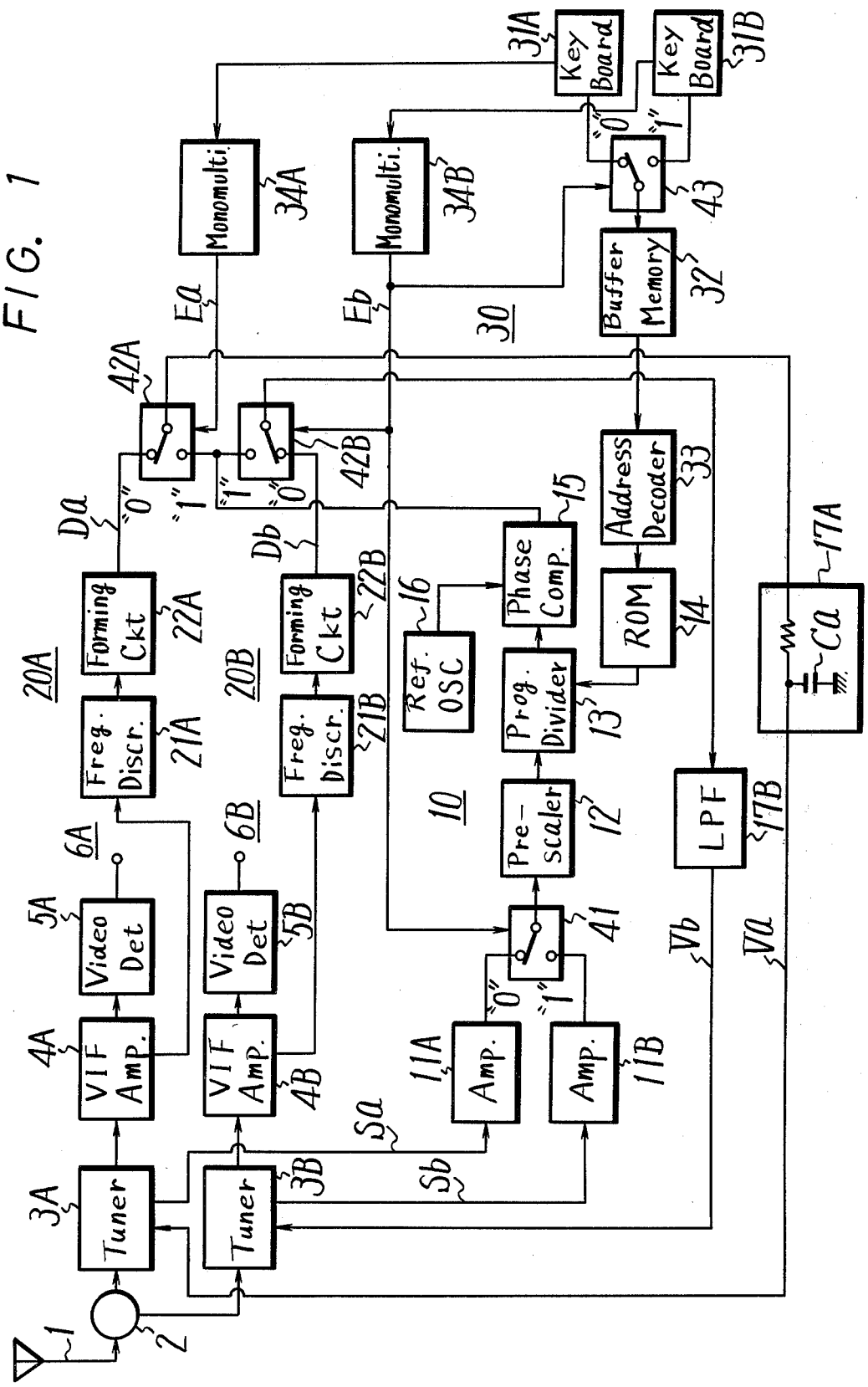
FIG. 1 is a block diagram of a television receiver according to one embodiment of the present invention.

Referring to the drawings in detail, and initially to FIG. 1 thereof, one embodiment of a television.

Turning to FIG. 1, an example of a television receiver according to the present invention will be described. In FIG. 1, an antenna distributor 2 receives an input signal from an antenna 1 and supplies an output signal to tuners 3A and 3B, respectively. Video intermediate frequency (VIF) amplifiers 4A and 4B respectively amplify the outputs from tuners 3A and 3B and supply signals to video detectors 5A and 5B, respectively. In this case, circuits 3A to 5A form a first signal receiving system 6A and circuits 3B to 5B form a second signal recieving system 6B. Further, each of the tuners 3A and 3B is constructed as an electronic tuning system and is capable of selecting a desired channel in response to a channel selecting voltage Va or Vb applied thereto. Also, as shown in FIG. 1, tuners 3A and 3B produce local oscillating signals Sa and Sb, respectively.

A feedback loop 10 such as a PLL (phase locked loop) is also provided in the circuit of FIG. 1 and includes a pre-scaler 12 supplied with the signals Sa and Sb through respective amplifiers 11A and 11B and a switch circuit 41, a programmable frequency divider 13 supplied with the output from pre-scaler 12, and a ROM (read only memory) 14 in which data determining the frequency dividing ratio of programmable frequency divider 13 in response to a channel to be received is written. Also, the circuit of FIG. 1 includes a phase comparator 15 supplied with the output from programmable frequency divider 13, a reference oscillator 16 which supplies a reference signal to another input of phase comparator 15 and low pass filters 17A and 17B, each including a capacitor Ca connected between phase comparator 15 and ground through switch circuits 42A and 42B, respectively.

Figure 2:
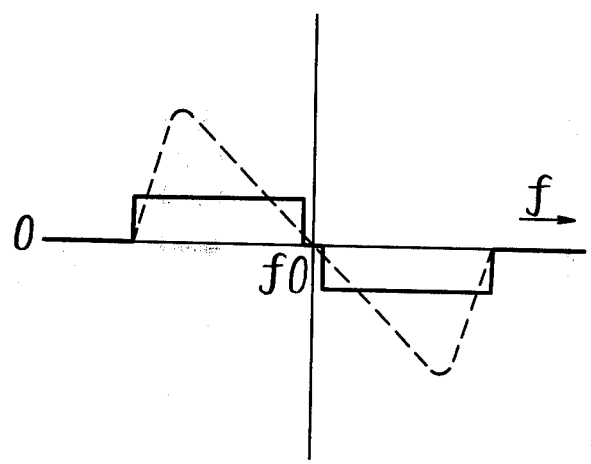
FIG. 2 is a waveform diagram used for explaining the embodiment of the invention shown in FIG. 1.

In addition, AFT (automatic frequency tuning) circuits 20A and 20B are provided which include frequency discriminators 21A and 21B which frequency-discriminate the VIF signals from the VIF amplifiers 4A and 4B, respectively, and produce the S-shaped voltage shown in FIG. 2 by the broken line, respectively, and forming circuits 22A and 22B which form the S-shaped voltages therefrom and produce digital AFT voltages Da and Db shown in FIG. 2 by the solid lines, respectively.

In FIG. 1, a control circuit 30 is also provided and includes a key board which has a channel selecting key for the first receiving system 6A, a key board 31B having a channel selecting key for the second receiving system 6B, a buffer memory 32 connected to the outputs of key boards 31A and 31B through a switch circuit 43, and an address decoder 33 which converts the output from the key boards 31A and 31B (through buffer memory 32) to an address signal for ROM 14. There are further provided monostable multivibrators 34A and 34B which respectively produce control signals Ea and Eb which are at logic level "1" for a time period of, for example, 0.5 to 1 second from the time when the channel selecting keys of the key boards 31A and 31B are respectively operated.

Further, switch circuits 41, 42A, 42B and 43 are respectively controlled by control signals Ea and Eb, so that they are connected at the positions shown in FIG. 1 when control signals Ea and Eb are both at logic level "0" and are connected opposite to the positions shown in FIG. 1 when control signals Ea and Eb are both at logic level "1".

Thus, according to the embodiment of the invention described in connection with FIG. 1, during the channel selecting operation, a channel is selected by PLL 10. In particular, when the channel selecting key of key board 31A corresponding to first receiving system 6A is operated, multivibrator 34A is triggered and produces signal Ea at logic level "1". At this time, since signal Eb is still at logic level "0", switch circuits 41, 42B and 43 remain at the connected positions shown in FIG. 1. Accordingly, the local oscillating signal Sa from tuner 3A is fed through buffer amplifier 11A, switch circuit 41 and pre-scaler 12 to programmable frequency divider 13. The output from key board 31A is also fed to address decoder 33 through switch circuit 43 and buffer memory 32 as an address signal. This latter signal is then fed to ROM 14 from which the data (dividing ratio) of the channel corresponding to the operated channel selecting key is derived. The data is in turn fed to programmable frequency divider 13 to be programmed as a dividing ratio.

Accordingly, signal Sa from tuner 3A is frequency-divided by divider 13 in response to the data from ROM 14. The frequency divided signal therefrom is fed to phase comparator circuit 15 to be phase-compared with the oscillating signal having a reference frequency from reference oscillator 16. At this time, signal Ea is at logic level "1" and hence, switch circuit 42A is connected at a position opposite to that shown in FIG. 1.

Therefore, the output from phase comparator 15 is supplied through switch circuit 42A to low pass filter 17A which, in turn, produces the DC voltage Va and supplies same to the tuner 3A as a channel selecting signal. Thus, when the channel selecting key of key board 31A is operated, first receiving system 6A is made operational by PLL 10 so as to receive the channel corresponding to the operated channel selecting key.

During normal or steady-state operation thereafter, such receiving state is maintained by AFT circuit 20A. In other words, after a predetermined time period from the time when the channel selecting key is operated, that is, after signal Ea returns to its logic level "0" state, switch circuit 42A returns to the state shown in FIG. 1. Accordingly, PLL 10 is disconnected from first receiving system 6A, and thereafter the receiving state of first receiving system 6A is maintained by voltage Va stored in capacitor Ca of filter 17A.

In such case, if voltage Va varies, for example, by leakage from capacitor Ca, the carrier frequency of the VIF signal in the first receiving system 6A is varied correspondingly and the AFT voltage Da from forming circuit 22A is also varied. This voltage Da is then applied through switch circuit 42A to filter 17A to cancel the voltage variation in capacitor Ca thereof. As a result, the voltage Va is maintained at a constant value to maintain the correct receiving state of that channel.

Also, when the local oscillating frequency varies due to fluctuation of the power source voltage, temperature variation or the like, or if an offset (shift or deviation in frequency) is presented in the video carrier frequency at a broadcasting station, the AFT voltage Da is similarly varied to lock the system at a desired receiving state.

Thus, as set forth above, when the channel selecting key of key board 31A according to the first receiving system 6A is operated, the channel selection of first receiving system 6A is carried out by means of PLL 10. Thereafter, the receiving state for the selected channel is maintained by AFT circuit 20A.

On the other hand, when the channel selecting key of key board 31B in second receiving system 6B is operated, multivibrator 34B is triggered and the output Eb therefrom becomes logic level "1". Thus, switch circuits 41, 42B and 43 are connected at positions opposite to those shown in FIG. 1. As a result, an operation similar to the previously-described operation when the channel selecting key of key board 31A was operated, is carried out by PLL 10, and the corresponding channel is selected. Thereafter, the correct receiving state for the channel is maintained by AFT circuit 20B.

As described above, according to the present invention, PLL 10 is operated for first and second receiving systems 6A and 6B only upon the respective channel selection thereof, and thereafter the receiving states for such systems are maintained by AFT circuits 20A and 20B, respectively. Therefore, in accordance with this invention only one set of associated circuitry including such components as expensive pre-scaler 12, programmable frequency divider 13, ROM 14, phase comparator 15, reference oscillator 16 and the like, is needed. Hence, this invention provides a novel, simple and economical circuit for selecting and maintaining a plurality of desired channels.

Further, according to the invention, during normal operation, the AFT circuit provides a stable channel receiving operation even in the presence of various fluctuations and frequency offset in the signal receiving system.

Turning now to FIG. 3, another embodiment of the present invention will be described in which elements corresponding to those described above with reference to the circuit of FIG. 1 are identified by the same reference numerals and will not be explained again. In the embodiment of FIG. 3, channel selection is carried out by a frequency locked loop (FLL) 50 serving as the feedback loop.

Figure 4:
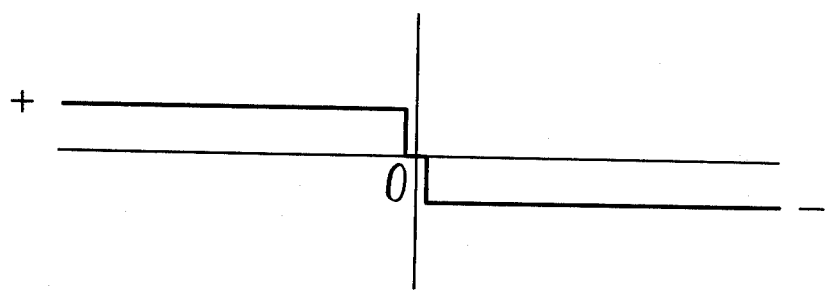
FIG. 4 is a waveform diagram used for explaining the embodiment of the invention shown in FIG. 3.

In FIG. 3, FLL 50 includes a frequency counter 51 supplied with the output from pre-scaler 12, a reference oscillator 52 which produces a time base signal for the count by counter 51, and a comparator 53, respectively. Comparator 53 compares the counted output from counter 51 with the data from ROM 14 and produces an output at logic level "0" when both signals applied thereto are equal or substantially equal, an output of "+" when the data from ROM 14 is larger than the output from counter 51, and an output of "−" when the output from counter 51 is larger than the data from ROM 14, respectively, as shown in FIG. 4.

In FIG. 3, UP/DOWN counters 54A and 54B are connected to comparator 53 through switch circuits 42A and 42B, respectively, and a pulse oscillator 55 produces pulses supplied to a count input of counters 54A and 54B. These counters 54A and 54B are thus respectively controlled in their count mode by the outputs from switch circuits 42A and 42B so as to be operative in an UP-count mode when the outputs from the switch circuits are "+", a DOWN-count mode when the outputs from the switch circuits are "−", and a STOP-count mode when the outputs from the switch circuits are at logic level "0", respectively.

In the example of FIG. 3, pulse width modulating (PWM) circuits 56A and 56B are also provided which receive the outputs from the counters 54A and 54B, respectively, and produce PWM signals with the pulse widths thereof corresponding to the counted values of counters 54A and 54B, respectively. Such PWM signals are supplied to low pass filters 17A and 17B, respectively.

In the embodiment of the invention shown in FIG. 3, channel selection is carried out by FLL 50. In particular, when, for example, the channel selecting key of key board 31A of first receiving system 6A is operated, multivibrator 34A is triggered. Therefore, the output Ea therefrom is at logic level "1", but the output Eb from multivibrator 34B is still at logic level "0", so that switch circuits 41, 42B and 43 remain connected to the positions shown in FIG. 3, respectively. Accordingly, the local oscillating signal Sa from the tuner 3A is applied through buffer amplifier 11A, switch circuit 41 and pre-scaler 12 to counter 51 which then counts the cycle number of the signal Sa per unit time and applies its counted output to comparator 53.

At this time, the output from key board 31A is also supplied to decoder 33 through switch circuit 43 and memory 32 as an address signal which is fed to the ROM 14. ROM 14 then produces the data of the channel corresponding to the operated channel selecting key and supplies the same to comparator 53 which, in turn, produces a compared output signal having a level which is a function of the counted output from counter 51 as shown in FIG. 4.

Further, at this time, signal Ea is at logic level "1" and hence, switch circuit 42A is connected at a position opposite to that shown in FIG. 3 so that the output from comparator 53 is fed through switch circuit 42A to counter 54A as a count mode control signal. PWM circuit 56A thus produces a PWM signal with a pulse width corresponding to the counted value of counter 54A and applies the same to filter 17A which, in turn, produces the voltage Va supplied to tuner 3A.

When the counted output from counter 51 is larger than the channel data from ROM 14, the compared output from comparator 53 becomes "−". Thus, counter 54A is operative in the DOWN-count mode with the result that the pulse width of the PWM signal from PWM circuit 56A increases so as to increase the level of the voltage Va from filter 17A. This results in a low receiving frequency. On the other hand, when the counted output from counter 51 is smaller than the channel data from ROM 14, the operation is reverse to that explained above with the result that the receiving frequency is high. Further, when the counted output from counter 51 becomes equal or approximately equal to the channel data from ROM 14, counter 54A is operative in the STOP-count mode. Accordingly, the receiving channel becomes set in response to the channel data from ROM 14.

As set forth above, when the channel selecting key of key board 31A in first receiving system 6A is operated, FFL 50 renders first receiving system 6A operational in its correct receiving state for the corresponding channel.

During normal or steady-state operation, such receiving state is maintained by AFT circuit 20A. In other words, after a predetermined time period from the time when the channel selecting key in key board 31A is operated, the signal Ea returns to its logic level "0" state so that switch circuit 42A is connected to the position shown in FIG. 3. Thus, voltage Da from forming circuit 22A is applied to counter 54A, so that the correct channel receiving state is maintained corresponding to the state during the channel selecting operation.

With the embodiment of the invention shown in FIG. 3, when the local oscillating frequency is varied by fluctuation of the power source voltage, temperature variation and the like, or if an offset exists in the video carrier frequency at the broadcast station, AFT voltage Da is similarly varied to lock first receiving system 6A to a desired receiving state.

On the other hand, when the channel selecting key of key board 31B in second receiving system 6B is operated, multivibrator 34B is triggered and the output signal Eb therefrom is at logic level "1". As a result, switch circuits 41, 42B and 43 are respectively connected to positions opposite to those shown in FIG. 3. Accordingly, an operation similar to that when the channel selecting key of key board 31A was operated is carried out by FLL 50 so that second receiving system 6B is operative in its respective channel receiving state to receive the corresponding channel. Thereafter, that state is maintained by AFT circuit 20B.

It should be appreciated that if the leakage from capacitor Ca of filters 17A and 17B, in the embodiment of FIG. 1 can be neglected, filters 17A and 17B merely serve as holding circuits for voltages Va and Vb, respectively. This means that if the AFT operation is unnecessary to correct drift of the local oscillating frequency by fluctuation of the power source voltage, by temperature variation, and for frequency offset, AFT circuits 20A and 20B may be omitted.

Further, in the embodiment of FIG. 3, since counters 54A and 54B respectively serve as the holding circuits for the voltages, AFT circuits 20A and 20B may similarly be omitted.

Having described specific preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

I claim as my invention

1. A television receiver comprising:
    at least two signal receiving means, each corresponding to a respective channel and each including tuner means for selecting said respective channel in response to a tuning control signal;
    storage means for storing each of said tuning control signals and for supplying said tuning control signals to said respective tuning means; and
    feedback means common to each of said at least two receiving means and adapted to be selectively operative with one of said at least two signal receiving means for producing the tuning control signal for the signal receiving means with which it is operative and supplying said respective tuning control signal to said storage means.

2. The television receiver according to claim 1; in which each of said tuner means produces an output and each of said signal receiving means further includes amplifier means for amplifying the output from the respective tuner means thereof and video detector means for detecting the amplified output from said amplifier means.

3. The television receiver according to claim 1; in which said feedback means is adapted to be connected between each of said tuner means and said storage means.

4. The television receiver according to claim 3; in which each of said tuner means produces an output, and said feedback means includes programmable divider means for dividing the output of the tuner means with which it is operative in response to input channel data corresponding to a selected channel, reference oscillator means for producing a reference oscillating signal, and comparator means for comparing the divided output from said programmable divider means and the reference oscillating signal from said reference oscillator means to produce said tuning control signal for the tuning means with which it is operative.

5. The television receiver according to claim 4; in which said programmable divider means frequency divides the output of the tuner means with which it is operative and said comparator means is a phase comparator which compares the phase of the frequency-divided output from said programmable divider means with the phase of the reference oscillating signal to produce the respective tuning control signal.

6. The television receiver according to claim 3; in which each of said tuner means produces an output, and said feedback means includes reference oscillator means for producing a time base signal, frequency counter means supplied with said time base signal and the output of the tuner means with which it is operative for producing a counted output, and comparator means for comparing the counted output with input channel data corresponding to a selected channel to produce said tuning control signal for the tuner means with which it is operative.

7. The television receiver according to claim 1; further comprising channel control means for controlling said feedback means to be selectively operative with one of said at least two signal receiving means, said channel control means including channel selection means for selecting a desired channel and producing a selection output in response thereto, first switch means for connecting said feedback means between said storage means and the tuner means of the signal receiving means corresponding to said desired channel, in response to said selection output, and means for controlling the operation of said feedback means in response to said selection output.

8. The television receiver according to claim 7; in which said means for controlling includes memory means for supplying channel input data to said feedback means for controlling the operation thereof, second switch means for transmitting a respective control signal from said channel selection means in response to said selection output, and decoder means for converting said respective control signal from said second switch means into an address signal for controlling the operation of said memory means.

9. The television receiver according to claim 8; in which each of said tuner means produces an output, and said feedback means includes programmable divider means for dividing the output of the tuner means with which it is operative, in response to said channel input data from said memory means.

10. The television receiver according to claim 8; in which each of said tuner means produces an output, and said feedback means includes comparator means for comparing the output from said tuner means with which it is operative with said channel input data from said memory means to produce the respective tuning control signal.

11. The television receiver according to claim 7; in which said first switch means includes a switching device connected between each of said tuner means and said feedback means for selectively supplying an output of said tuner means of the signal receiving means corresponding to said selected channel, to said feedback means, in response to said selection output.

12. The television receiver according to claim 7; in which said storage means includes at least two storage devices, each connected to a respective one of said tuner means, and said first switch means includes at least two switching devices, each connected between said feedback means and a respective one of said storage devices for selectively supplying the respective tuning control signal corresponding to the selected channel to the respective storage device.

13. The television receiver according to claim 7; in which said channel selection means includes multivibrator means for producing said selection output in the form of a digital signal of shorter duration.

14. The television receiver according to claim 1; in which said storage means includes at least two storage devices, each connected to a respective one of said tuner means.

15. The television receiver according to claim 14; in which each of said storage devices includes a low pass filter having capacitor means connected between said feedback means and a reference potential for storing the respective tuning control signal as a voltage.

16. The television receiver according to claim 14; in which each of said storage devices includes UP/DOWN counter means supplied with the respective tuning control signal from said feedback means and with reference pulses for producing a counted output, pulse width modulating means for producing pulse width modulated signals with the pulse widths thereof corresponding to the counted output from the respective UP/DOWN counter means, and low pass filter means connected between the pulse width modulating means and a respective one of said tuning means.

17. The television receiver according to clam 1; in which said storage means includes at least two storage devices, each associated with a respective one of said tuner means, and said television receiver further comprises at least two automatic frequency tuning means, each associated with a respective one of said storage devices and a respective one of said signal receiving means for maintaining the tuning control signal stored in the respective storage device at a constant value after said feedback means is no longer operative with said respective signal receiving means.

18. The television receiver according to claim 17; in which each of said tuner means produces an output, each of said signal receiving means further includes amplifier means for amplifying the output from the respective tuner means thereof, and each of said automatic frequency tuning means includes frequency discriminator means for frequency-discriminating the amplified output signal from the amplifier means of the signal receiving means with which it is associated and forming means for producing an AFT signal from the frequency-discriminated signal of the respective frequency discriminator means which is supplied to the respective storage device after said feedback means is no longer operative with said respective signal receiving means.

* * * * *